(12) United States Patent
Chen et al.

(10) Patent No.: US 11,474,165 B2
(45) Date of Patent: Oct. 18, 2022

(54) MAGNETIC SENSOR COMPONENT AND ASSEMBLY

(71) Applicant: Melexis Technologies SA, Bevaix (CH)

(72) Inventors: Jian Chen, Heist-op-den-Berg (BE); Orlin Gueorguiev Saradjov, Sofia (BG)

(73) Assignee: MELEXIS TECHNOLOGIES SA, Bevaix (CH)

( * ) Notice: Subject to any disclaimer, the term of this patent is extended or adjusted under 35 U.S.C. 154(b) by 118 days.

(21) Appl. No.: 17/084,947

(22) Filed: Oct. 30, 2020

(65) Prior Publication Data
US 2021/0048489 A1 Feb. 18, 2021

Related U.S. Application Data

(63) Continuation of application No. 16/361,973, filed on Mar. 22, 2019, now Pat. No. 11,067,645.

(30) Foreign Application Priority Data

Mar. 24, 2018 (EP) .................................... 18163816

(51) Int. Cl.
 *G01R 33/00* (2006.01)
 *H01L 23/495* (2006.01)
 (Continued)

(52) U.S. Cl.
 CPC .... *G01R 33/0047* (2013.01); *H01L 23/49541* (2013.01); *H01L 23/49562* (2013.01);
 (Continued)

(58) Field of Classification Search
 CPC .................................................. G01R 33/0047
 See application file for complete search history.

(56) References Cited

U.S. PATENT DOCUMENTS

| 4,540,226 A | 9/1985 | Thompson et al. |
| 4,951,124 A | 8/1990 | Sawaya |

(Continued)

FOREIGN PATENT DOCUMENTS

| EP | 0508615 A1 | 10/1992 |
| JP | S6413754 A | 1/1989 |

(Continued)

OTHER PUBLICATIONS

Extended European Search Report from EP Application No. 18163816. 4, dated Sep. 19, 2018.

(Continued)

*Primary Examiner* — Reena Aurora
(74) *Attorney, Agent, or Firm* — Workman Nydegger

(57) ABSTRACT

A sensor comprises a housing; and a lead frame comprising at least three elongated leads having an exterior portion extending from the housing; and a magnetic sensor circuit disposed in the housing, and connected to the lead frame. The housing comprises two recesses arranged on two opposite sides of the housing for allowing the sensor to be mounted to a support. The lead frame may further comprise a plurality of tabs disposed between the elongated leads, for use as test pins. A component assembly comprising said sensor mounted on a support between deformable protrusions. A method of making said component assembly, comprising the step of positioning said component on the support between said protrusions, and deforming said protrusions such that they are at least partially disposed within the recesses.

17 Claims, 14 Drawing Sheets

(51) Int. Cl.
*H05K 3/34* (2006.01)
*H05K 3/30* (2006.01)

(52) U.S. Cl.
CPC .......... *H05K 3/303* (2013.01); *H05K 3/3426* (2013.01); *H05K 2201/1081* (2013.01); *H05K 2201/10598* (2013.01); *H05K 2201/10659* (2013.01); *H05K 2203/167* (2013.01)

(56) References Cited

U.S. PATENT DOCUMENTS

| | | | |
|---|---|---|---|
| 5,643,835 | A | 7/1997 | Chia et al. |
| 5,890,281 | A | 4/1999 | Thaller et al. |
| 5,978,229 | A | 11/1999 | Kim |
| 6,476,476 | B1 | 11/2002 | Glenn |
| 7,220,135 | B1 | 5/2007 | Brekosky et al. |
| 7,880,291 | B2 | 2/2011 | Park et al. |
| 8,480,411 | B1 | 7/2013 | Ho et al. |
| 9,570,672 | B2 * | 2/2017 | Chen ................ H01L 21/565 |
| 9,620,391 | B2 * | 4/2017 | Hauser .............. H01L 21/565 |
| 2004/0113240 | A1 | 6/2004 | Hauser et al. |
| 2005/0237760 | A1 | 10/2005 | Tsukamoto et al. |
| 2005/0284238 | A1 * | 12/2005 | Wilkie ............... G01G 19/4142 |
| | | | 73/862.045 |
| 2006/0192273 | A1 | 8/2006 | Lange et al. |
| 2009/0135067 | A1 | 5/2009 | Chen et al. |
| 2012/0196405 | A1 | 8/2012 | Sakamoto et al. |
| 2018/0113001 | A1 * | 4/2018 | Offermann ............ H01L 28/40 |

FOREIGN PATENT DOCUMENTS

| | | |
|---|---|---|
| JP | H06132449 A | 5/1994 |
| JP | H1186987 A | 3/1999 |

OTHER PUBLICATIONS

European Search Report from EP Application No. 19163121.7, dated Aug. 13, 2019.

* cited by examiner

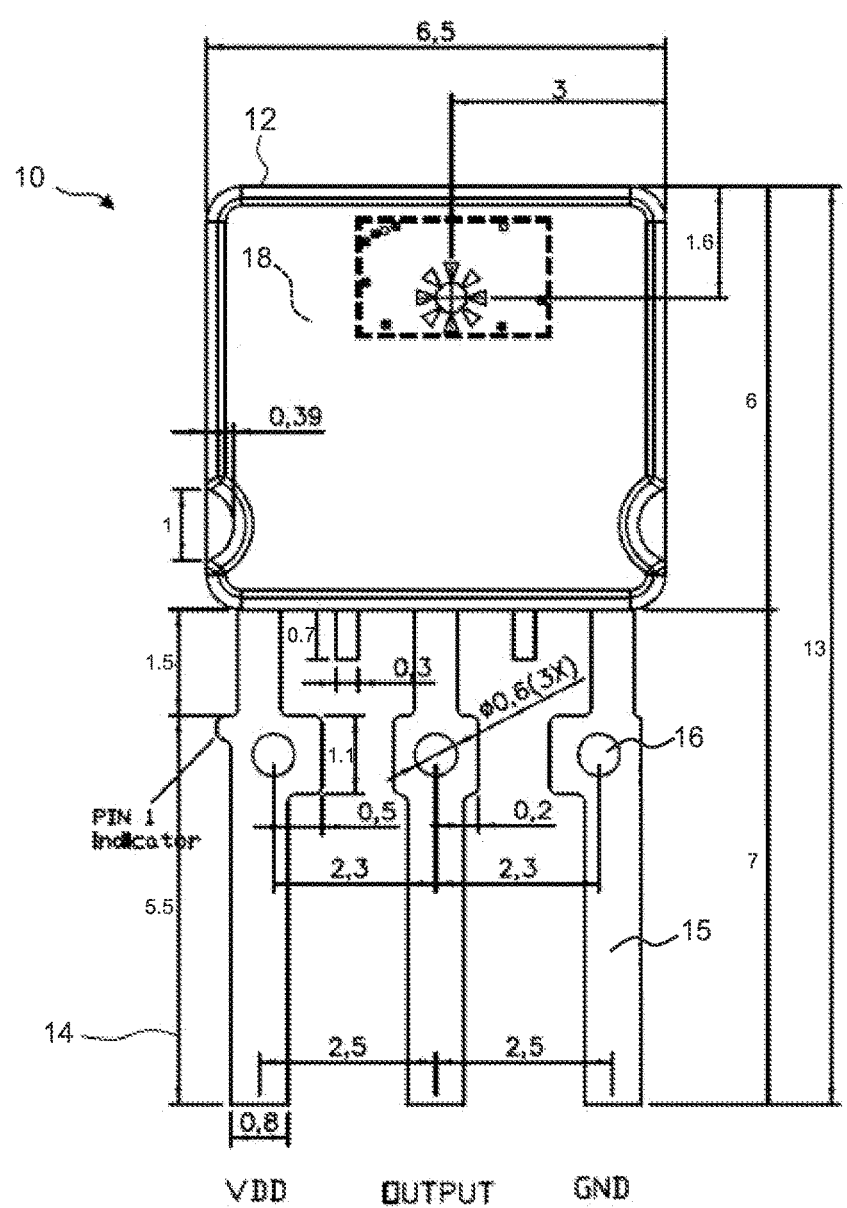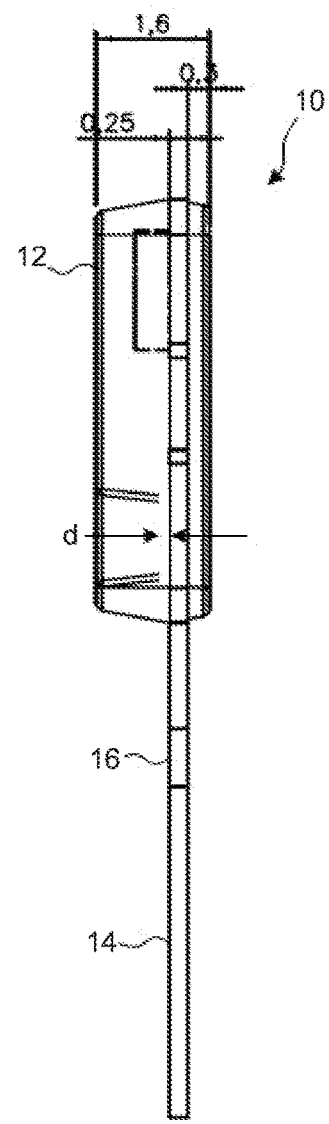
FIG. 3A
FIG. 3B

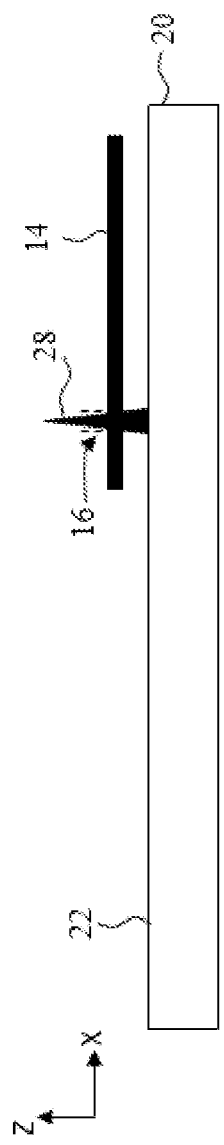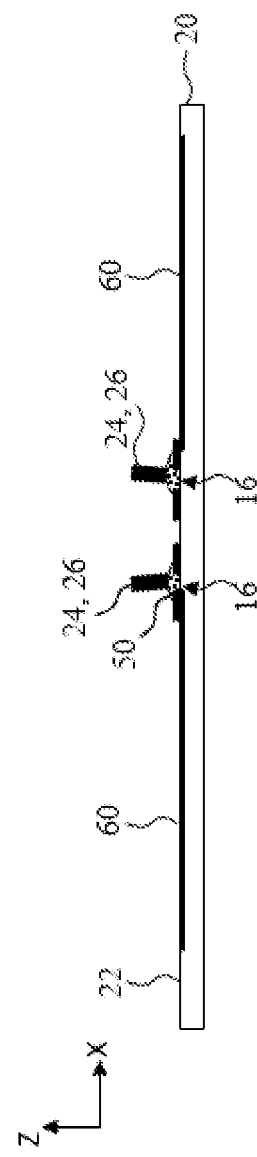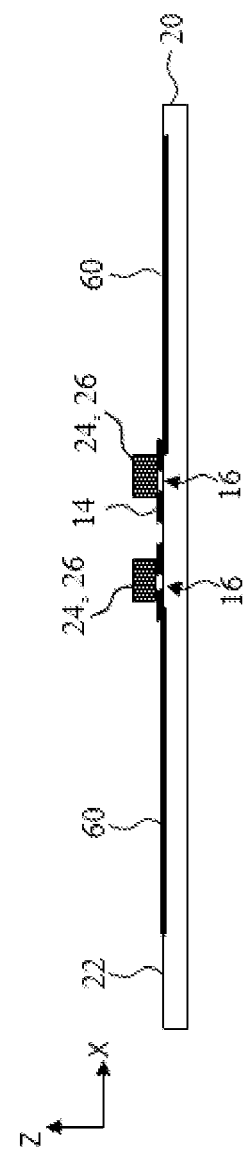

MAGNETIC SENSOR COMPONENT AND ASSEMBLY

FIELD OF THE INVENTION

The present invention relates to an electronic component with a magnetic sensor circuit, having provisions for accurate positioning of said component on a support.

BACKGROUND OF THE INVENTION

Sensors are widely used in electronic devices to measure attributes of the environment and report a measured signal value. In many applications, the exact location of the sensor within the sensor system is an important element of the overall sensor system.

Some conventional electronic devices assembled on printed circuit boards comprise leads (electrical connection pins) extending from a device housing. An electronic circuit, for example an integrated circuit, is disposed in the housing and conventionally adhered to a lead frame with leads extending through the housing to provide electrical connections exterior to the housing to the integrated circuit within the housing. Contacts on the integrated circuit die are electrically connected to the leads with wire bonds inside the housing. The exterior portion of the leads extending from the housing can be inserted into holes in the printed circuit board or in a socket with socket pins inserted into holes in the printed circuit board. For example, dual inline packages (DIPs) and sockets having two rows of connection pins are commonly used, as described in U.S. Pat. No. 4,540,226.

Printed circuit boards frequently include connectors soldered into holes to provide access to the devices on the printed circuit boards (see, for example U.S. Pat. No. 8,480,411). In other applications, multiple boards, for example daughter cards are sometimes stacked together, for example as disclosed in U.S. Pat. Nos. 5,890,281 and 7,220,135.

In more recent years, surface-mount packages and assembly techniques have dispensed with connection pins and simply rely on electrical connections provided on the housing and positioned on a printed circuit board. The electrical connections are subsequent soldered to circuit board contact pads to electrically connect and locate the surface-mount electronic devices on the circuit board.

One method used to locate devices with respect to a surface uses guide pins. For example, U.S. Pat. No. 5,978,229 describes guide pins positioned in the corners of a socket that mate with non-standard holes on a circuit board. A related method is used to stack and electrically connect integrated circuits. Each circuit has projecting pins on the bottom and receiving holes on the top, as disclosed in U.S. Pat. Nos. 7,880,291 and 6,476,476.

These prior-art techniques do not always provide the precision needed for locating electronic devices, such as magnetic sensors, in a two-dimensional or three-dimensional space within an electronic system. Furthermore, prior-art techniques do not always provide accurate z-axis location (orthogonal to the typical x and y dimensions defining the surface of a printed circuit board) and are not necessarily suitable for systems in which the electronic devices are not disposed on a printed circuit board.

There is a need, therefore, for alternative positioning methods and structures for electronic devices within electronic systems.

SUMMARY OF THE INVENTION

It is an aim of the present invention to provide a sensor which can be accurately positioned, and to provide a component assembly comprising said sensor, and a method of making said component assembly.

It is an aim of embodiments of the present invention to provide such a sensor which can be mounted in a manner where movements in any direction is blocked.

It is an aim of embodiments of the present invention to provide such a sensor which can be mounted in a manner where movement in any direction is block and which is more compact than existing solutions.

It is an aim of embodiments of the present invention to provide a sensor, which has provisions for improved testing without negatively influencing its compactness.

It is an aim of embodiments of the present invention to provide a sensor component, which has provisions for improved testing, while using standard dimensions of the leads required during normal operation, such that it can be produced and/or handled by standard tools.

These and other objects are accomplished by a sensor, and a component assembly, and a method according to embodiments of the present invention.

In a first aspect, the present invention provides a component, more in particular, a sensor, comprising: a housing; a lead frame comprising at least three elongated leads having an exterior portion extending from the housing; a magnetic sensor circuit disposed in the housing, and connected to the lead frame; the housing comprising two (and preferably only two) recesses arranged on two opposite sides of the housing for allowing the component to be mounted by heat-stacking.

It is an advantage of providing a housing with at least two recesses, because this allows to precisely position the component by means of these recesses (e.g. by heat staking), and at the same time to firmly clamp the component at and by means of these recesses.

It is a particular advantage of using recesses (as opposed to clamping side walls without recesses) that the risk of shifting in a direction parallel to these walls is eliminated.

The component may further comprise at least one passive electrical component (such as e.g. a capacitor and/or a resistor and/or a diode) also embedded inside the housing.

Preferably the lead frame is exposed only on one side, (namely at the side where the leads extend from the housing).

In an embodiment, the recesses are located at a predefined distance above the lead frame, and overlap at least a portion of the lead frame surface.

The predefined distance may be at least 0.2 mm, which is sufficient to guarantee that the lead frame is not exposed.

With the "recesses are overlapping at least a portion of the lead frame" is meant that a perpendicular projection of the recesses onto the plane containing the lead frame overlaps with a portion of the lead frame.

It is an advantage that the recesses are located at a predefined non-zero distance above the lead frame. This offers the advantage that such lead frame is not exposed to the environment at this location, thereby reducing the risk of corrosion or contamination of the magnetic sensor circuit and/or other components in the housing.

It is an advantage if the recesses are overlapping at least a (metallic) portion of the lead frame, because this allows to more accurately position and more firmly clamp the component (as compared to a clamping force exerted at the top of the molding package further away from the lead frame).

In an embodiment, the recesses have a shape comprising a bottom portion substantially parallel to the lead frame.

The bottom portion may be located at substantially half the height of the housing. This offers the huge advantage that (after heat stacking) movement in three dimensions is blocked, in contrast to for example recesses which extend over the full height of the component.

In an embodiment, the recesses have a frusto-conical wall portion or a cylindrical wall portion.

This may offer the advantage that the component will auto-align when exerting a downward force above the two recesses when mounting the component (e.g. by using heat staking).

In an embodiment, the housing comprises only two recesses located on two opposite sides of the component, and the lead frame is only exposed on one side of the housing, (namely at the side) where the leads extend from the housing.

This offers the advantage that less material is required, and that the component can be more compact, since the lead frame does not need to extend at the side opposite leads, and thus that the receiving zone that accommodates the component can be made smaller.

In an embodiment, the exterior portion of the elongated leads comprises a proximal portion having a first width, and a distal portion having a second width, the first width being smaller than the second width; and the lead frame further comprises a plurality of tabs or pins extending from the housing, each tab or pin being located substantially halfway between pairs of adjacent elongated leads, and having an exterior length smaller than an exterior length of the proximal portions of the elongated leads and/or having an exterior width smaller than the first width of the proximal portions of the elongated leads.

It is an advantage that the elongated leads have proximal portions (adjacent the housing) with a reduced width, because this allows to provide additional test-pins between adjacent proximal portions, while maintaining as much as possible typical or standard mechanical dimensions and/or tolerances of the lead frame and the leads.

Such tabs or pens or pins are ideal for use as test pins, e.g. to allow measurement of signals of the circuit, without needing the sizes and tolerances typically required for soldering.

It is an advantage of such component that it has a plurality of tabs or pens or pins which can be connected to the circuit and which can be used as test pins, without requiring a larger package. This offers the best of both worlds: low cost due to smaller package (than would be needed if only elongated leads were used), and improved testability.

It is an advantage of this embodiment that it provides a component with a compact package with additional contacts.

According to a second aspect, the present invention also provides a component assembly, comprising: a support having a receiving zone and at least two deformable protrusions adjacent the receiving zone; and a sensor according to the first aspect, disposed on or over the support within the receiving zone between said protrusions such that the recesses are adjacent said protrusions; and wherein the protrusions are at least partially disposed within the recesses.

It is an advantage of using deformable protrusions, because it allows the component to be fixed to the support without additional material supply (e.g. a resin). This may greatly simplify the mounting process. The protrusions may comprise or consist of a thermoplastic and/or a metal and/or a metal alloy.

In embodiments, the support is a printed circuit board.
In embodiments, the support is not a printed circuit board.
In embodiments, the support is a plastic support.

In embodiments, the support is a plastic support without conductive tracks.

In an embodiment, the component assembly further comprises at least one passive electrical component; said passive electrical component being comprised inside the housing of the component.

The at least one passive electrical component may be or comprise a capacitor and/or a resistor and/or a diode.

Preferably the component containing the magnetic sensor circuit is the only component mounted on the support, and all passive electrical components (if present) which would normally be mounted on a PCB, are now integrated inside said component housing. This is a very compact solution, and allows the assembly to contain a sensor and passive components, however without requiring that these passive components are mounted and electrically interconnected on the support.

According to a third aspect, the present invention also provides a method of producing a component assembly, comprising the steps of: a) providing a sensor according to the first aspect; b) providing a support having a receiving zone and at least two deformable protrusions adjacent the receiving zone; and c) disposing the sensor on or over the support within the receiving zone between said protrusions such that the recesses are adjacent said protrusions; and d) deforming the protrusions such that the protrusions are at least partially disposed within the recesses, thereby aligning and clamping the sensor.

It is an advantage that the protrusions and the corresponding (or mating) recesses provide both an aligning function and a fixation function.

According to a fourth aspect, the present invention also provides a sensor, optionally but not necessarily having the features of a sensor according to the first aspect, the sensor comprising: a housing; a circuit disposed in the housing; a lead frame comprising at least a first elongated lead, and a second elongated lead substantially parallel to the first elongated lead, each of the first and second elongated lead having an exterior portion extending from the housing; the first elongated lead comprising a first alignment hole, and the second elongated lead comprising a second alignment hole, each alignment hole configured to receive a respective positioning pin.

It is an advantage of such component that it can be precisely positioned and/or firmly connected to for example a printed circuit board, by means of the alignment holes.

It is an advantage of such component that the alignment holes can also be used for load bearing purposes, for example when the component is mounted on a printed circuit board subject to vibrations. In this way, the risk that the component moves or shifts over time, or that the soldering of the leads breaks, is substantially eliminated.

It is an advantage that the alignment holes are provided in the leads, because in this way standard package dimensions and tooling (e.g. for producing the package and/or for pick and placement) can be used, or they require only minimal changes.

In an embodiment, the exterior portion of each of the first and second elongated lead comprises a proximal portion having a first width, and a distal portion having a second width larger than the first width, and a central portion having a third width larger than the first width; and wherein the central portion of the first elongated lead comprises the first alignment hole, and the central portion of the second elongated lead comprises the second alignment hole.

The width of the central portion may be smaller than, equal to, or larger than the second width.

It is an advantage of providing the alignment holes in the central portion, because this portion is closer to the housing than the distal portions (which are typically soldered), thus mounting tolerances can be improved.

It is an advantage that the elongated leads have three different widths, because it allows to provide both alignment holes in the elongated leads proper, and allows to provide additional test-pins between two adjacent proximal portions, while maintaining the mechanical tolerances of the lead frame.

In an embodiment, the lead frame further comprises a plurality of tabs extending from the housing, each tab located substantially halfway between pairs of adjacent elongated leads.

Such tabs are ideal for use as test pins, to allow measurement of signals of the circuit, without needing the sizes and tolerances typically required for guaranteed soldering.

It is an advantage of such component that it has a plurality of tabs which can be connected to the circuit and which can be used as test pins, without requiring a larger package. This offers the best of both worlds: low cost due to smaller package (than would be needed if only elongated leads were used), and improved testability.

It is an advantage of this embodiment that it provides a component with a compact package with additional contacts.

Preferably, each tab has a width smaller than the first width of the proximal portion of the elongated leads, and smaller than the second width of the distal portion of the elongated leads.

Preferably, each tab has an exterior length smaller than an exterior length of the proximal portions.

With "exterior length" is meant the length of the portion exterior to the housing.

In the example of FIG. 3A, the exterior length of the proximal portions is equal to about 1.5 mm, and the exterior length of the tabs is equal to about 0.7 mm.

In an embodiment, the lead frame comprises only three elongated leads and only one or only two tabs.

In an embodiment, the lead frame comprises only five elongated leads and only one or only two or only three or only four tabs.

In an embodiment, the exterior length of the tabs is smaller than 1.0 mm.

In an embodiment, the width of the tabs is a value in the range from 0.2 to 0.4 mm.

It is an advantage of such tabs that they occupy only minimal space, and thus allow sufficient distance from the leads, which is good for EMI and EMC.

This also reduces the risk of making a short circuit between the tab and the adjacent elongated lead when measuring a signal on the tab using for example a probe of an oscilloscope.

The distance between center lines of proximal portions of adjacent elongated leads may be equal to about 2.5 mm, and/or a distance between center lines of distal portions of adjacent leads may be equal to about 2.5 mm, and/or a distance between centers of adjacent alignment holes may be equal to about 2.3 mm.

The first width (46) of the proximal portions may be a value in the range from 0.5 mm to 0.7 mm.

The third width (44) of the central portions may be a value in the range from 1.1 to 1.3 mm.

The first width 46 of the proximal portion may be equal to about 0.6 mm.

The second width 42 of the distal portion may be equal to about 0.8 mm.

The third width 44 of the central portion may be equal to about 1.2 mm.

In an embodiment, each of the first and second elongated leads is electrically connected to the circuit.

In an embodiment, at least one of said tabs or pens or pins is electrically connected to the circuit.

In an embodiment, each of said tabs is electrically connected to the circuit.

In an embodiment, each of said first and second elongated leads further comprise at least two alignment protrusions extending transversely from said leads.

This may further improve positioning accuracy. These protrusions may engage with mating recesses or openings in a printed circuit board, for example.

The two alignment protrusions preferably extend transversely from the central portion of the respective elongated leads.

In an embodiment, the circuit comprises at least one discrete passive component.

In an embodiment, the circuit comprises a magnetic sensor circuit.

According to a fifth aspect, the present invention also provides a component assembly, comprising: a support having a receiving zone, and at least a first and a second positioning pin disposed on and protruding from the support in the receiving zone; and a sensor according to the fourth aspect, disposed on or over the support within the receiving zone, wherein the first positioning pin is disposed within the first alignment hole, and the second positioning pin is disposed within the second alignment hole.

It is an advantage of using deformable protrusions, because it allows the component to be fixed to the support without additional material supply (e.g. resin).

The protrusions may comprise or consist of a thermoplastic and/or a metal and/or a metal alloy.

In embodiments, the support is not a printed circuit board.

In embodiments, the support is a plastic support.

In embodiments, the support is a plastic support without conductive tracks.

In an embodiment, a portion of the positioning pin is disposed over a portion of the elongated lead adjacent the alignment hole.

The positioning pin may for example be bend or otherwise deformed.

According to a sixth aspect, the present invention also provides a method of making a component assembly, comprising the steps of: providing a sensor according to the fourth aspect; providing a support with a receiving zone and a first and a second positioning pin disposed on and protruding from the support in the receiving zone; and disposing the sensor on or over the support with the first positioning pin located within the first alignment hole of the sensor component, and with the second positioning pin located within the second alignment hole of the component.

In an embodiment, the method comprises: bending or deforming one or both of the first and second positioning pin so that at least a portion of the positioning pin is located over a portion of the elongated lead adjacent the alignment hole.

It is explicitly pointed out that features of the first embodiment and the fourth embodiment can be combined, and that features of the second and fifth embodiment can be combined, and that features of the third and sixth embodiment can be combined.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1 to FIG. 10 are mainly intended to illustrate a sensor component having leads with holes.

FIG. 1 is a perspective view of illustrative embodiments of the present invention;

FIG. 3A is a top view, and FIG. 3B is a side view of illustrative embodiments of the present invention corresponding to FIG. 1;

FIG. 4 is a perspective view of illustrative embodiments of the present invention having a component with three leads, each lead comprising one alignment hole, disposed on a support with three corresponding positioning pins;

FIG. 5 is a perspective view of illustrative embodiments of the present invention having a component with one lead comprising two alignment holes and one lead with no alignment holes disposed on a support with two positioning pins disposed within the two alignment holes;

FIG. 7 is a schematic side view according to illustrative embodiments of the present invention comprising positioning pins providing z-axis location;

FIG. 8 is a schematic side view according to illustrative embodiments of the present invention comprising bent positioning pins;

FIG. 9 is a schematic side view according to illustrative embodiments of the present invention comprising deformed positioning pins; and FIG. 10 is a flow diagram of illustrative methods of the present invention.

FIG. 11 is a variant of FIG. 2A, and shows another exemplary component according to an embodiment of the present invention.

FIG. 12 is a variant of FIG. 3A, and shows a top view of the component of FIG. 11 without the housing, for illustrative purposes.

FIG. 13 shows the component of FIG. 11 in top view.

FIG. 14 shows the component of FIG. 13 in front view.

FIG. 15 shows the component of FIG. 11 and an exemplary support comprising two protrusions for holding said component.

FIG. 16 shows a component assembly comprising the support and the component of FIG. 15, according to an embodiment of the present invention.

FIG. 17 shows the component of FIG. 11 and another exemplary support comprising two beam-shaped protrusions for holding said component.

FIG. 18 illustrates a method of producing a component assembly, according to an embodiment of the present invention.

Figure 1:
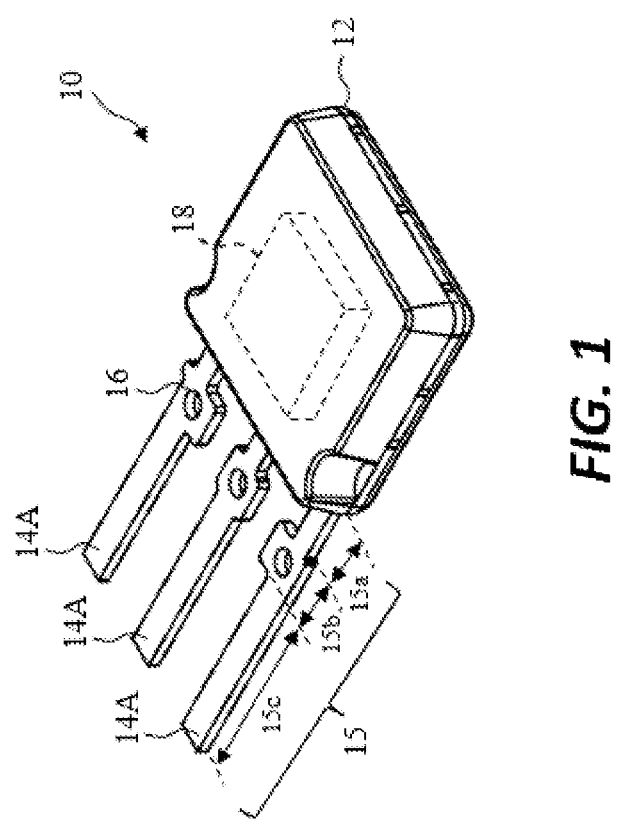

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF THE INVENTION

Electronics manufacturing processes typically pick-and-place electronic components, such as integrated circuits, onto a substrate such as a printed-circuit board or into a test fixture. However, such placement processes have a limited positional accuracy and the actual position of the integrated circuit on the printed circuit board or in the test fixture can vary somewhat. Embodiments of the present invention can provide improved positioning of electronic devices in low-cost structures that are easy to make and adapt to a wide variety of circumstances and that provide simple electrical connections to the electronic device.

The cost of electronic components is largely determined by its package, and the choice of package is often dictated by the number of external connections. There is often a tradeoff to be made between a large package with a large number of pins, with good testability but a higher cost of the component and requiring more space, versus a smaller package with a smaller number of pins, with reduced testability, but a lower cost, and requiring less space.

Figure 2A:
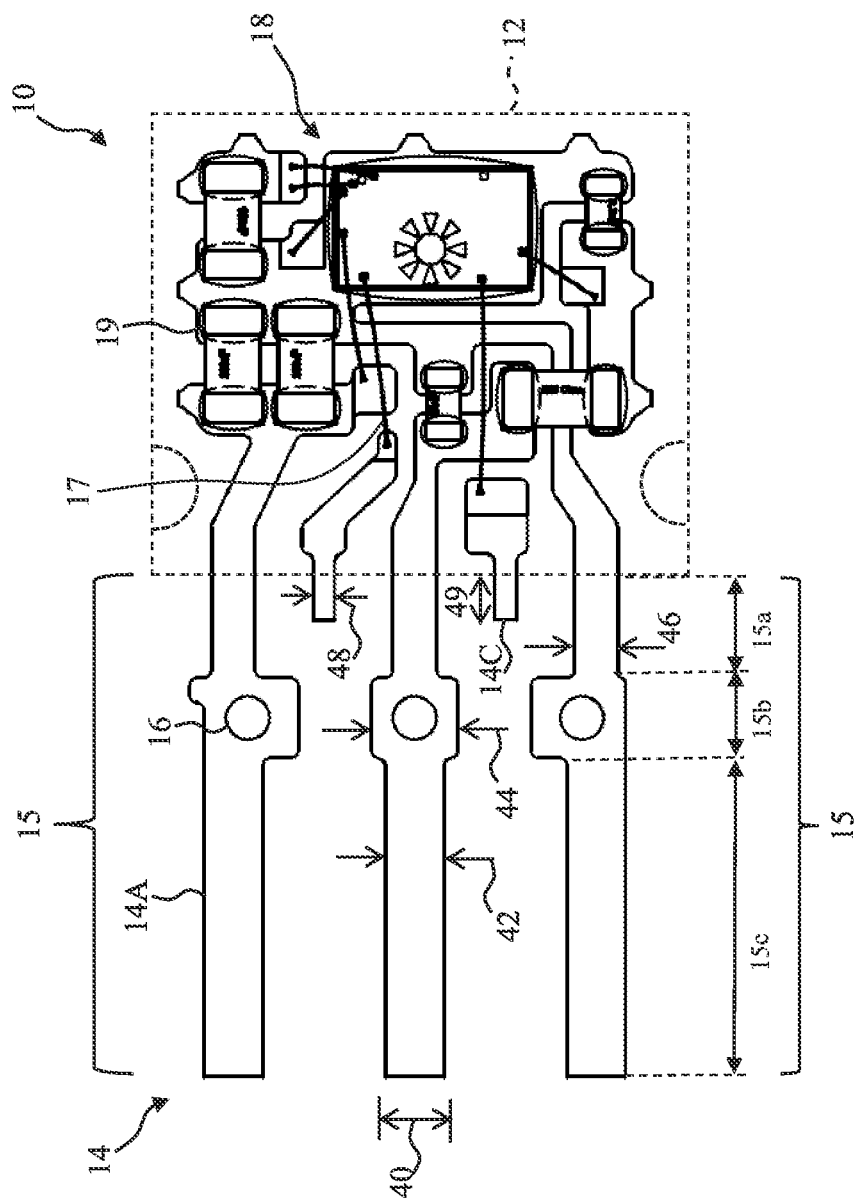
FIG. 2A is a top view of illustrative embodiments of the present invention corresponding to FIG. 1.

Referring to FIG. 1 in perspective view, FIG. 2A in a top view, and FIG. 3A and FIG. 3B as top and side views of a design drawing, in some embodiments of the present invention a component 10 comprises a housing 12, a circuit 18 disposed in the housing 12, one or more leads 14 each having an exterior portion 15 extending from the housing 12, and at least two alignment holes 16. Unless explicitly mentioned otherwise, the term "component" actually means a "sensor" or "sensor chip".

More in particular, the component 10 shown in FIG. 1 comprises three elongated leads 14A, including a first elongated lead with a first alignment hole, and a second elongated lead comprising a second alignment hole, and a third elongated lead comprising a third alignment hole. The elongated leads are parallel.

The alignment holes 16 are disposed in the exterior portion 15 of the leads 14A and are configured to receive a positioning pin 24 (examples of which are shown in FIG. 4 to FIG. 9).

Circuit 18 can be an electronic circuit, for example an integrated circuit, disposed in the housing 12 and electrically connected with wire bonds to an interior portion of the leads 14 located inside the housing 12. Circuit 18 can be an analog circuit, a digital circuit, or a mixed signal circuit and can include both integrated and discrete components, for example including a discrete passive component 19 such as a resistor or a capacitor or a diode (shown in FIG. 2A). Circuit 18 can be a sensor such as a magnetic sensor or position sensor. The response provided by such magnetic or position sensor can be very dependent on the precise location of the sensor, and the location of the circuit 18 is important to the proper or accurate functioning of the component 10. Moreover, fixing the position of the leads 14 provides improved positioning accuracy compared to prior-art techniques of locating the housing or package of an integrated circuit, for example for a molded package or housing.

Housing 12 can serve as a body of the component 10 that may have a cavity in which a semiconductor substrate and any discrete components are disposed and electrically connected. The semiconductor substrate may comprise an integrated circuit die formed in, on, or as a part of the semiconductor substrate. The elongated leads 14A may be electrically connected to the integrated circuit die and/or to the passive component(s) 19 via wire bonds 17. Housing 12 can be, for example, a ceramic or plastic package, as is known in the integrated circuit industry.

Leads 14 are typically also referred to as "fingers" or "pins" or "connection pins" and can serve as electrical connections to the circuit 18. Leads 14 can be electrically conductive and can comprise metal or a metal alloy, for example comprising copper, aluminum, tin, silver, gold or other metals and can be formed into a variety of shapes for example by stamping or die cutting or other metal-forming methods known in the art. Similarly, alignment holes 16 in leads 14 can be formed by stamping, die cutting, molding or other known methods. Leads 14 can be coated or layered. Leads 14 can have different lengths, shapes, and may be connected to different elements of the component 10, for example to different contact pads of circuit 18.

In some embodiments of the present invention, at least two of the leads 14 (e.g. a first and a second lead) are electrically connected leads 14A, electrically connected to the circuit 18, and an alignment hole 16 is disposed in each of the at least two leads 14A. In the exemplary embodiment of FIG. 2A the component 10 has three elongated leads, and each of these three leads has an alignment hole, but that is not absolutely required. It suffices that two of the leads, preferably the two outer leads, have an alignment hole. The alignment hole in the middle lead me be omitted.

In some embodiments (see for example FIG. 4), one or more of the leads 14 are disconnected leads 14B that are not electrically connected to the circuit 18, but may also have an alignment hole 16.

Figure 5:
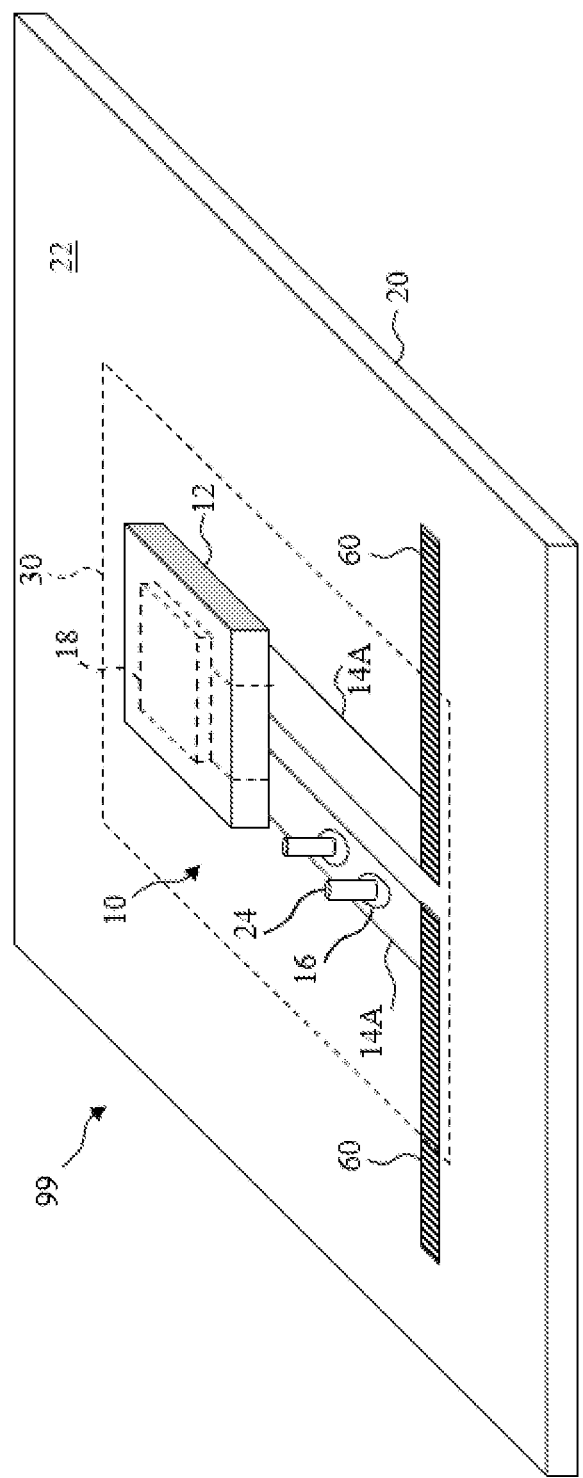

In some embodiments, a lead 14 can comprise multiple alignment holes 16. For example, FIG. 5 illustrates an embodiment in which one connected lead 14A has two alignment holes 16, and another connected lead 14A has no alignment holes 16.

In other embodiments, a component 10 can have any combination of connected or disconnected leads 14A, 14B each with no alignment holes 16, one alignment hole 16, or two or more alignment holes 16.

The embodiment of FIG. 2A illustrates a component with three connected leads 14A each with one alignment hole 16.

In various embodiments of the present invention and referring to FIG. 1 and FIG. 2A, the elongated leads 14 may have multiple portions with different widths. For example, a proximal portion 15a having a first width 46, and a distal portion 15c having a second width 42, and a central portion 15b having a third width 44. In preferred embodiments, the width 46 of the proximal portion is smaller than the width 42 of the distal portion, and the width 46 of the proximal portion is smaller than the width 44 of the central portion. This makes it possible to simultaneously obtain the following advantages: (i) to provide leads having distal portions 15c with a standard spacing (e.g. about 2.5 mm between their center lines); and (ii) to provide central portions 15b with alignment holes 16; and (iii) to provide tabs 14C (also referred to herein as "second leads" or "test pins" or simply as "pins") for use as test pins; and (iv) without requiring a package with more elongated leads, and without having to use non-standard dimensions between the leads, as the latter may have a negative impact on the connectability of these leads using standard equipment.

According to some embodiments of the present invention, an exterior portion 15 of a lead 14 has an average width 40 and the width 44 of the central portion 15b of the lead 14 at the location of the alignment hole 16 is greater than the average width 40.

In some embodiments, the width 46 of the proximal portion 15a of the lead 14 adjacent to the housing 12 is less than the average width 40. By decreasing the first width 46 of the proximal portion, space can be provided for additional connections (i.e. the tabs 14C), and by increasing the width of the central portion 15b of the lead 14 at the location of the alignment hole 16, a robust mechanical structure can be provided.

The housing of the component 10 shown in FIG. 1 and FIGS. 2A-2C also comprises two recesses 13, but these are not mandatory in the embodiments shown in FIG. 1 to FIG. 10. In contrast, the embodiments of FIG. 11 to FIG. 18 are related to the recesses 13 but do not absolutely require leads with positioning holes 16.

As shown in FIG. 2A and FIG. 3, the tabs (also referred to herein as "test pins" or "pens" or "pins" or "short leads") 14C have a fourth width 48 smaller than each of the first width 46, the second width 42, and the third width 44. The short leads or tabs 14C do not have alignment holes 16. The short leads 14C may provide test connections for the component 10 without increasing the size of the component 10 or the spacing of the leads 14, in particular of the distal portions 15c thereof.

In the embodiment shown in FIG. 1 to FIG. 3, the package has only three elongated leads 14A and only two tabs 14C located between said leads, but the present invention is not limited hereto, and packages with only five elongated leads and four tabs located in between the leads are also envisioned.

Figure 2B:
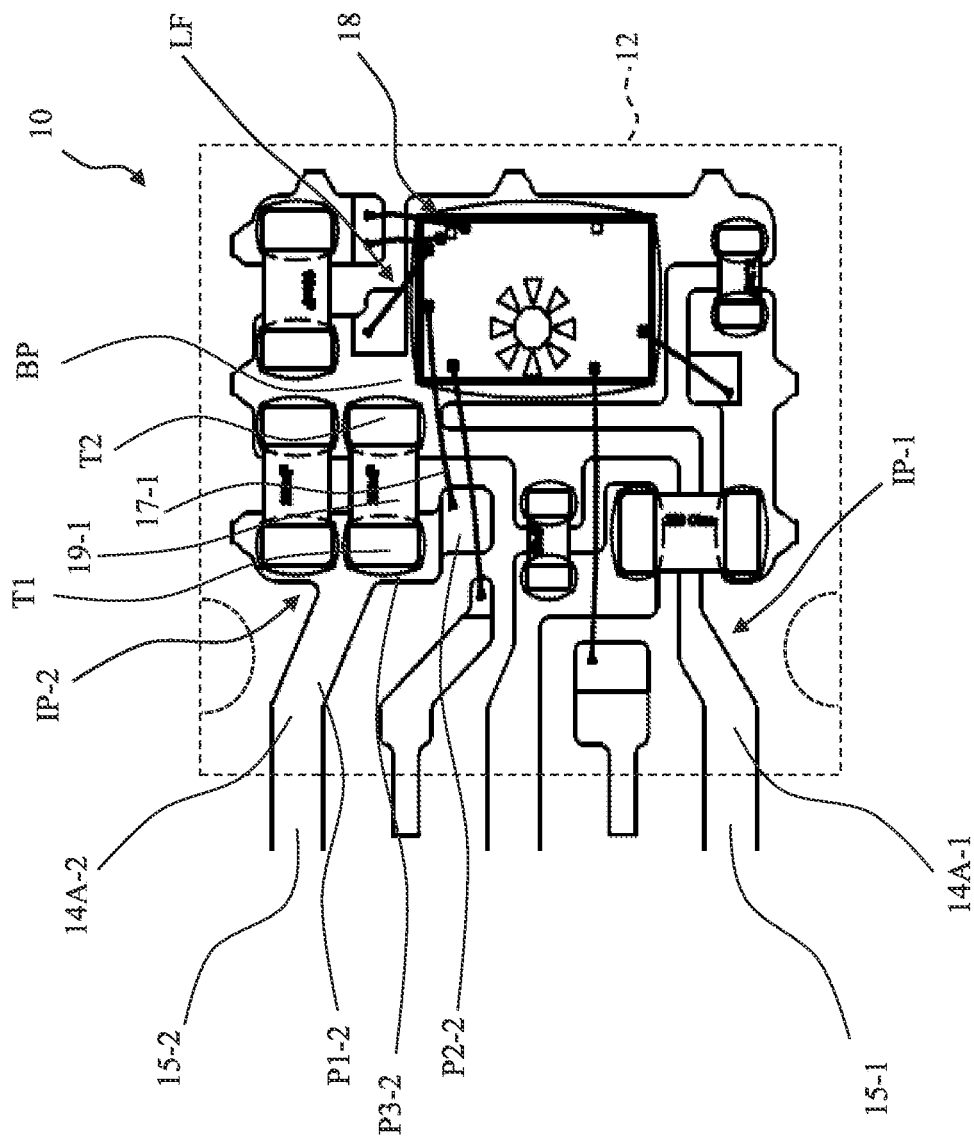
FIG. 2B shows an enlarged, annotated portion of the top view of FIG. 2A.

FIG. 2B shows an enlarged, annotated portion of the top view of FIG. 2A. As identified in FIG. 2B, the embodiment of FIG. 2A includes a sensor that includes a housing 12, a magnetic sensor circuit 18 provided within the housing 12, and a lead frame LF that includes a body portion BP and a plurality of elongated leads 14A-1, 14A-2. At least a portion of the body portion BP of the lead frame LF supports the magnetic sensor circuit 18. Each of the elongated leads 14A-1, 14A-2 includes an interior portion IP-1, IP2 (respectively) and an exterior portion 15-1, 15-2 (respectively). Each of the interior portion IP-1, IP-2 is located inside the housing 12 and each of the exterior portions 15-1, 15-2 extends from the housing 12. The elongated leads 14A-1, 14A-2 include a first lead 14A-1 and a second lead 14A-2. The first lead 14A-1 is integrally formed with the body portion BP of the lead frame LF. The interior portion IP-2 of the second lead 14A-2 includes a first portion P1-2 proximal to the exterior portion 15-2, a second portion P2-2 that is integral with the first portion P1-2, and an intermediate portion P3-2. The intermediate portion P3-2 of the second lead 14A-2 is situated electrically between the first portion P1-2 of the second lead 14A-2 and the second portion P2-2 of the second lead 14A-2. The sensor 10 further comprises at least a first bond wire 17-1 electrically connecting the second portion P2-2 of the second lead 14A-2 and the magnetic sensor circuit 18. The sensor 10 further comprises at least a first passive, discrete component 19-1 situated inside the housing 12. The first passive, discrete component 19-1 has a first terminal T1 electrically connected to the intermediate portion P3-2 of the second lead 14A-2, and has a second terminal T2 electrically connected to the body portion BP, which is integrally formed with the first lead 14A-1. The first portion P1-2 of the second lead 14A-2 extends from the intermediate portion P3-2 of the second lead 14A-2 to the exterior portion 15-2 of the second lead 14A-2.

Figure 2C:
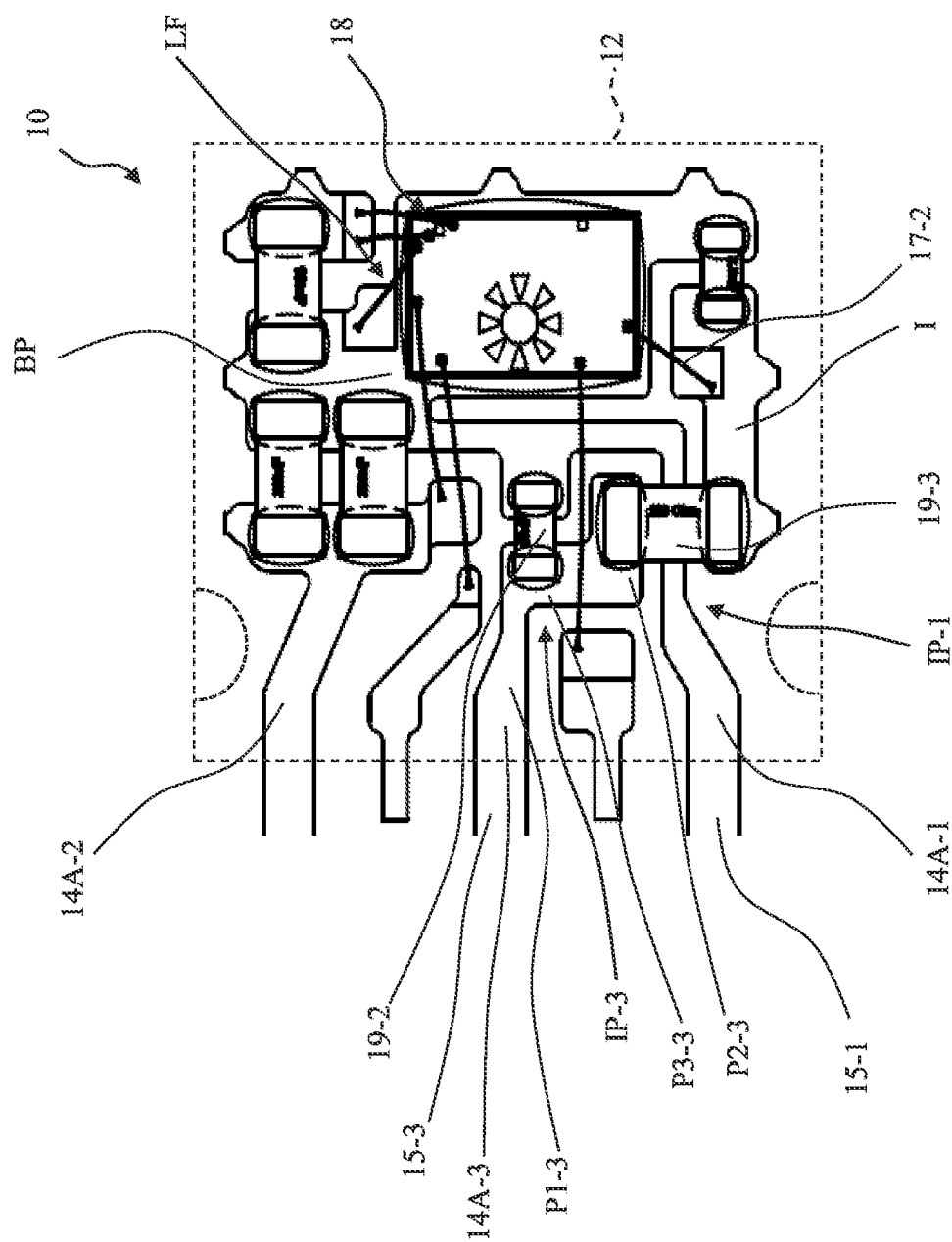
FIG. 2C shows the enlarged portion of the top view of FIG. 2A with further annotations.

As further annotated in FIG. 2C, the lead frame LF of the embodiment of FIG. 2A further includes an island I and the elongated leads further includes a third lead 14A-3. The interior portion IP-3 of the third lead 14A-3 includes a first portion P1-3 proximal to the exterior portion 15-3 of the third lead 14A-3, a second portion P2-3 that is integral with the first portion P1-3 of the third lead 14A-3, and an intermediate portion P3-3. The intermediate portion P3-3 of the third lead 14A-3 is situated electrically between the first portion P1-3 of the third lead 14A-3 and the second portion P2-3 of the third lead 14A-3. The second portion P2-3 of the third lead 14A-3 is distal from the exterior portion 15-3 of the third lead 14A-3. The first portion P1-3 of the third lead 14A-3 extends from the intermediate portion P3-3 of the third lead 14A-3 to the exterior portion 15-3 of the third lead 14A-3. The intermediate portion P3-3 of the third lead 14A-3 is electrically connected to the first lead 14A-1 by at least a second passive, discrete component 19-2. The island I is electrically connected to the second portion P2-3 of the third lead 14A-3 by at least a third passive, discrete component 19-3. The sensor 10 of the embodiment of FIG. 2A further comprises a second bond wire 17-2 electrically connecting the island I and the magnetic sensor circuit 18. The second bond wire 17-2 and the second passive, discrete component 19-2, and the third passive, discrete component 19-3 are situated in the housing 12.

Figure 4:
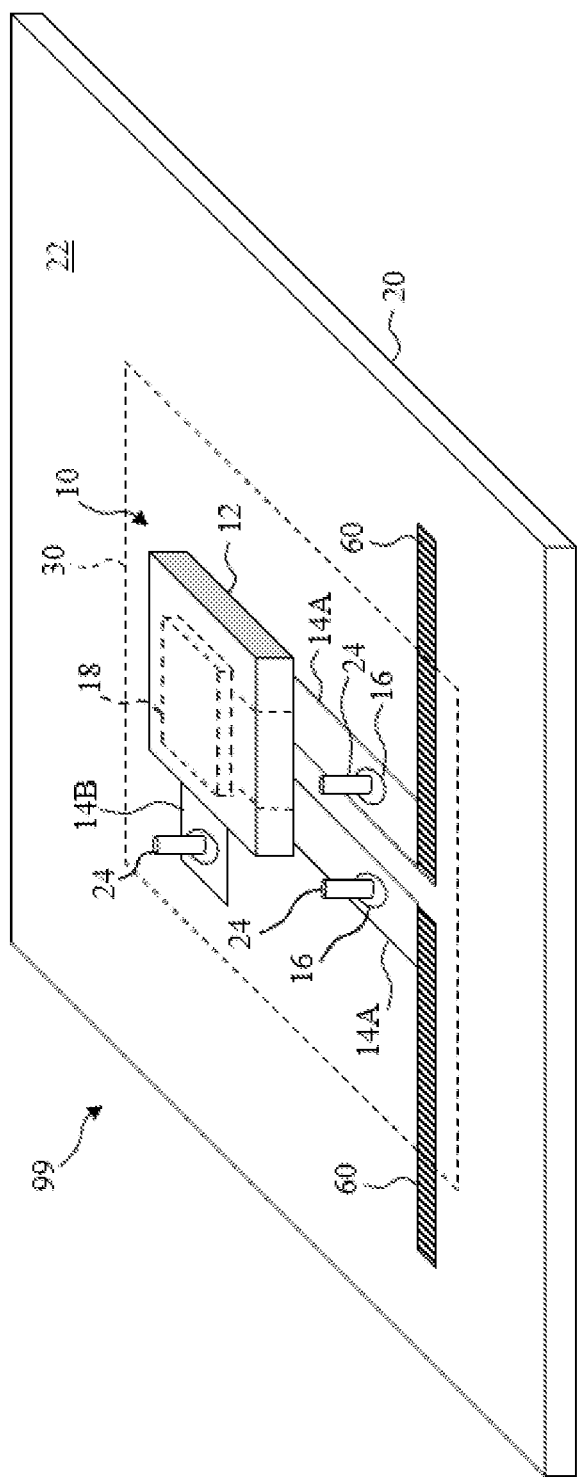

Referring to FIG. 4 and FIG. 5, a component assembly 99 of the present invention can comprise a support 20. The support 20 can have a surface 22 with a receiving zone 30 in which one or more components 10 can be disposed, for example by pick-and-place equipment. One or more positioning pins 24 are disposed on and protrude from the support 20 in the receiving zone 30. A component 10 is disposed on or over the surface 22 of the support 20 within the receiving zone 30.

A positioning pin 24 can be disposed within only one alignment hole 16 of the component, or a positioning pin 24 can be disposed within each of at least two alignment holes 16 of the component, or a positioning pin 24 can be disposed within each alignment hole 16 of the component.

As shown in FIG. 4, the component 10 may have both connected leads 14A that are electrically connected to the circuit 18, and disconnected leads 14B that are not electrically connected to the circuit 18. (Connected leads 14A and disconnected leads 14B are collectively referred to herein as leads 14.) Both connected leads 14A and disconnected leads 14B may have an alignment hole 16 with a positioning pin 24 disposed in the alignment holes 16. A positioning pin 24 can be, but is not necessarily, electrically conductive and may be electrically connected to a lead 14.

Referring to FIG. 5, the component 10 can have connected leads 14A electrically connected to the circuit 18, some of which have more than one alignment hole 16 and some of which do not have any alignment holes 16. It is an advantage of this embodiment that the component 10 can be accurately positioned by means of only one elongated lead.

Figure 6A:
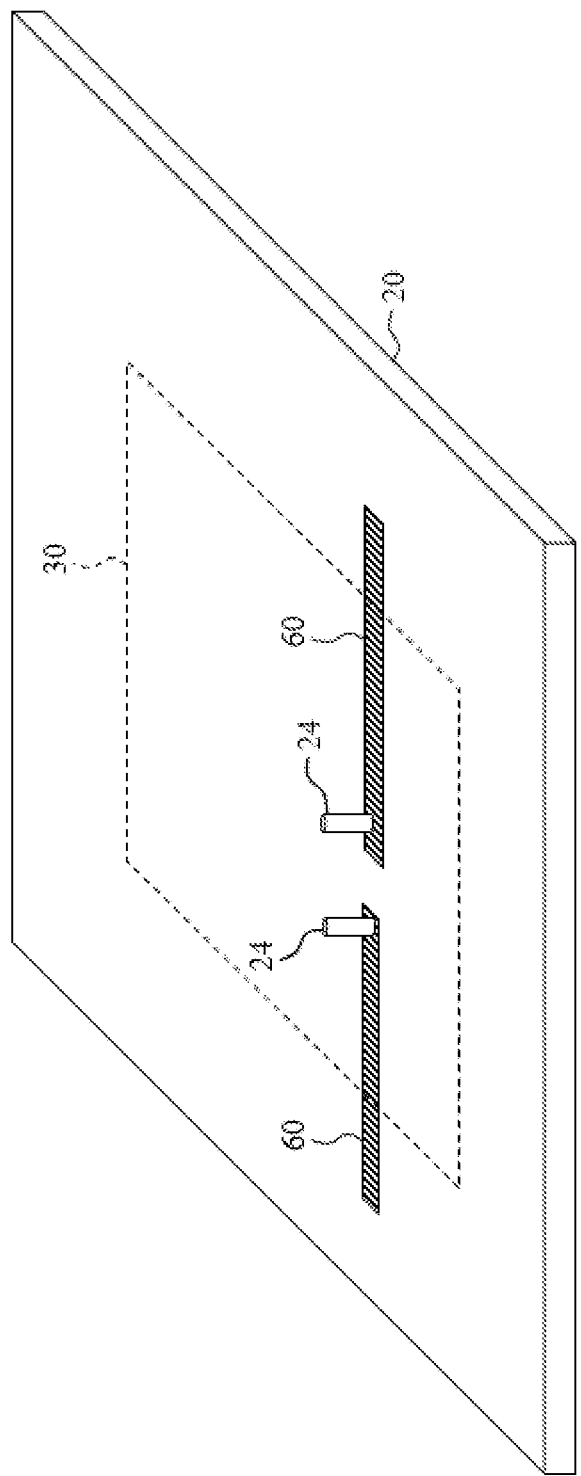
FIG. 6A is a perspective view according to illustrative embodiments of the present invention comprising a support with positioning pins and wires.
Figure 6B:
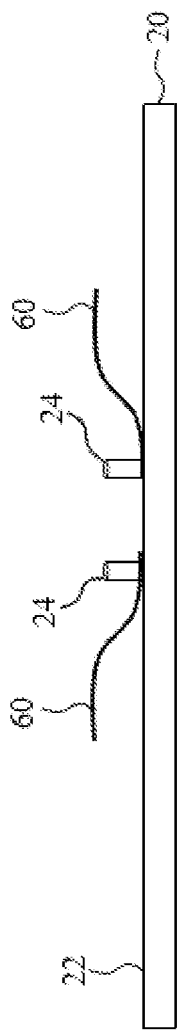
FIG. 6B is a schematic side view according to illustrative embodiments of the present invention comprising a support with positioning pins and electrically connecting wire cables.

A support 20 can be planar (as shown in FIG. 4 and FIG. 5) or non-planar (not shown). A support 20 can have wires 60 integrated into the support 20 to form, for example, a printed circuit board or other wiring board or wires 60 can be provided separately from the support 20. A wire 60 can be electrically connected to each connected lead 14A. Referring to FIG. 6A, wires 60 can be directly connected, mechanically or electrically, to the positioning pins 24 or leads 14, or both. Referring to FIG. 6B, wires 60 can be provided independently of the support 20, for example as cables that are electrically connected to leads 14 directly (as shown) or indirectly (not shown). In some embodiments, the cable wires 60 can be directly connected to the positioning pins 24.

In various embodiments, the support 20 can comprise a resin or epoxy substrate, a multi-layer structure, for example planar structures, a cast, molded, or machined part or structure, for example comprising a polymer, metal, metal alloy, or ceramic. Likewise, the positioning pins 24 can be cast, molded, or machined, or formed by etching a part or structure. The positioning pins 24 may be electrically conductive or electrically insulating, and may comprise a polymer, metal, metal alloy, or ceramic. The positioning pins 24 may be rigid, flexible, compliant, or ductile. A positioning pin 24 may be electrically connected to each of, any one of, or none of the leads 14 and the wires 60.

According to embodiments of the present invention, the positioning pins 24 disposed in the alignment holes 16, for example by locating components 10 on the receiving zone 30 on or over the surface 22 of the support 20 with the positioning pins 24 disposed in the alignment holes 16 by pick-and-place equipment, serve to precisely locate the component 10 with respect to the support 20 in a simple and inexpensive way that can be applied to a broad variety of component assembly structures. By requiring at least two positioning pins 24 in respective alignment holes 16, the component 10 is spatially fixed in position with respect to the support 20 so that component 10 cannot rotate or move with respect to the support 20. By providing alignment holes 16 in the leads 14, additional alignment or mounting structures are rendered unnecessary, for example special housing 18 and support 20 structures, so that the components 10 can be smaller and take up less area of the support 20. Or stated in other words, for the particular package shown in FIG. 1 and FIG. 3, by providing alignment holes 16 in the three elongated leads 14, other structures (e.g. located at the corners of the lead frame) can be avoided, thus layout structures and existing mounting equipment can still be used.

Referring to FIG. 7, in an embodiment the location of the component 10 is controlled in the height direction or the z-axis (controlled with respect to the distance between the surface 22 of the support 20 and the component 10). The height of the component 10 with respect to the support 20 can be controlled with a positioning pin 24, for example by providing a variable diameter positioning pin 28 with a variable diameter that can accept an alignment hole 16 at only certain predefined z-axis locations or predefined heights above the support 20. The variable diameter may be continuous, as shown, or discontinuous, for example with stepped structures (not shown). In the case where circuit 18 is a sensor, e.g. a magnetic position sensor, the precise location of the sensor and any discrete passive components 19 can be important to the proper or accurate functioning of the sensor.

In some embodiments of the present invention, after the component 10 is disposed with positioning pins 24 in alignment holes 16, the positioning pin 24 can be deformed so that a portion of the positioning pin 24 is disposed over a portion of the electrically conductive exterior portion 15 of the lead 14 that is not the alignment hole 16 in the lead 14, e.g. adjacent the alignment hole. For example, as shown in FIG. 8, the positioning pin 24 is deformed by bending the positioning pin 24 so that a portion of the bent deformed positioning pin 26 is located over a non-alignment-hole portion of the lead 14, that is over a conductive portion of the lead 14, such as a metallic portion, and is not only over the alignment hole 16.

In the example of FIG. 9, the positioning pin 24 is deformed by flattening the positioning pin 24 so that a portion of the flattened deformed positioning pin 26 is located over a metal portion of the lead 14, adjacent the alignment-hole 16.

Positioning pins 24 may be mechanically deformed, e.g. plastically or permanently deformed (in contrast to elastically deformed), for example by striking the positioning pin 24 with a hammer on the side of the positioning pin 24 to bend it or on the top of the positioning pin 24 to flatten it. By deforming a positioning pin 24 within an alignment hole 16 of a lead 14, a component 10 is held in place and is not readily removed from the positioning pin 24 and support 20.

In other or additional embodiments of the present invention, the wire 60, positioning pin 24 and lead 14 may be soldered together with solder 50 to form an electrical connection electrically connecting the circuit 18 to the wires 60 and the positioning pin 24 through the lead 14, if the lead 14 is a connected, electrically conductive lead 14A and the positioning pin 24 is electrically conductive, so that the positioning pin 24 is electrically connected to the lead 14 in whose alignment hole 16 the positioning pin 24 is disposed.

Figure 10:
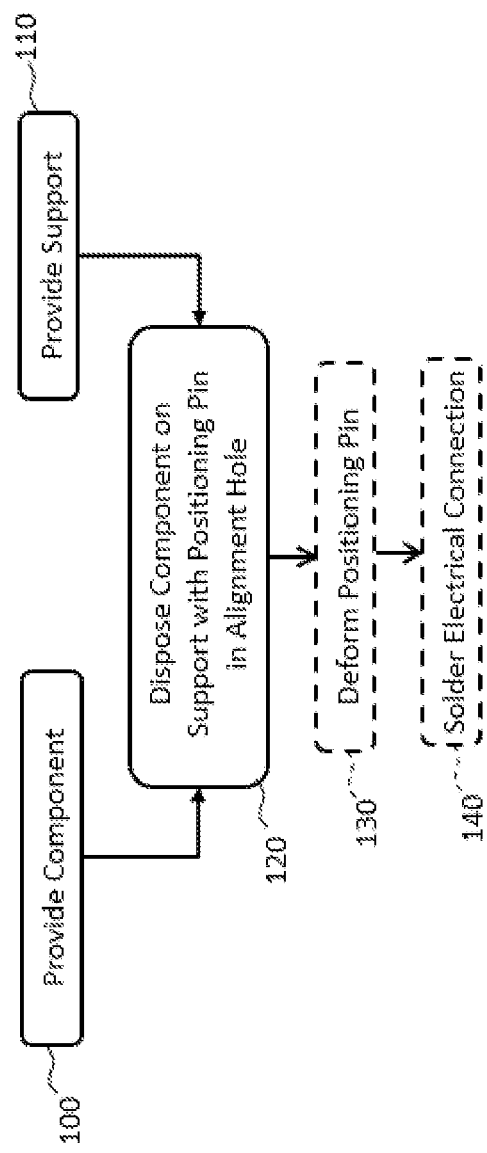

Referring to the flow-chart of FIG. 10, a component assembly 99 of the present invention can be constructed by providing a component 10 as described above in step 100, for example using photolithographic methods to form a circuit 18, for example comprising an integrated circuit (IC) and optionally one or more discrete passive or active circuit elements, assembling the IC and circuit elements onto a substrate, for example a semiconductor, glass, or ceramic substrate, and interconnecting them with any combination of wire bond or photolithographic methods and tools to form an assembled circuit 18. Leads 14 are constructed using metal forming methods and integrated into a housing 12 into which the assembled circuit 18 is disposed and electrically connected to the interior portion of the leads 14 inside the housing 12 using, for example, wire bonding methods. The housing 12 is then enclosed and encapsulated as desired.

A support 20 with one or more protruding positioning pins 24 is provided in step 110, for example by molding or laminating layers of resin or casting, molding, or machining materials such as ceramics, metals, or metal alloys into a desired shape, the shape providing a surface 22 with positioning pins 24 protruding from a surface 22 of the support 20 within a pre-determined receiving zone 30 for locating a component 10. In some embodiments, positioning pins 24 are partly inserted in through-holes of a PCB, and optionally soldered at the bottom side.

In step 120, a component 10 is disposed on a support 20 such that the alignment holes 16 of the component 10 are aligned with the positioning pins 24 of the support, and the positioning pins 24 are inserted into the alignment holes 16 (or vice versa), for example using pick-and-place equipment from a tape-and-reel package.

Once the component 10 is properly disposed in the receiving zone 30 of the support 20, in optional step 130 the positioning pins 24 can be optionally deformed to firmly, rigidly, permanently or irreversibly hold the component 10 in position with respect to the support 20. Multiple positioning pins 24 may be bent in different directions or deformed to widen the position pins 24, thus preventing each lead 14 from escaping the corresponding positioning pin 24.

The deformation may locate at least a portion of the positioning pin 24 over a metal portion of the lead 14, adjacent the alignment hole 16. The deformation can provide mechanical robustness to the component assembly 99 and prevent the differential movement of the component 10 and the support 20, for example as a result of vibration.

In optional step 140, the positioning pins 24 may optionally be soldered to the leads 14, for example to provide electrical connections between the lead 14 and the wire 60, and optionally the positioning pin 24. The solder 50 can also provide additional mechanical strength to the physical connection between the component 10 and the support 20.

In operation, power may be provided to a wire 60 and hence to a lead 14 and circuit 18. Signals from the circuit 18 are sent through another lead 14 and wire 60 to a controller (not shown in the figures).

FIG. 11 to FIG. 14 show another exemplary component 10 according to an embodiment of the present invention. The component of FIG. 11 to FIG. 14 can be seen as a variant of FIG. 2A. The main differences being that the component of FIG. 11 to FIG. 14 does not necessarily comprise alignment holes, and that the elongated leads 14A do not necessarily contain three segments having three different widths, but may contain two segments having two different widths. Other features described above may also be applicable here. The main focus of the embodiments of FIG. 11 to FIG. 18 is related to the recesses 13, as will be discussed further.

Figure 11:
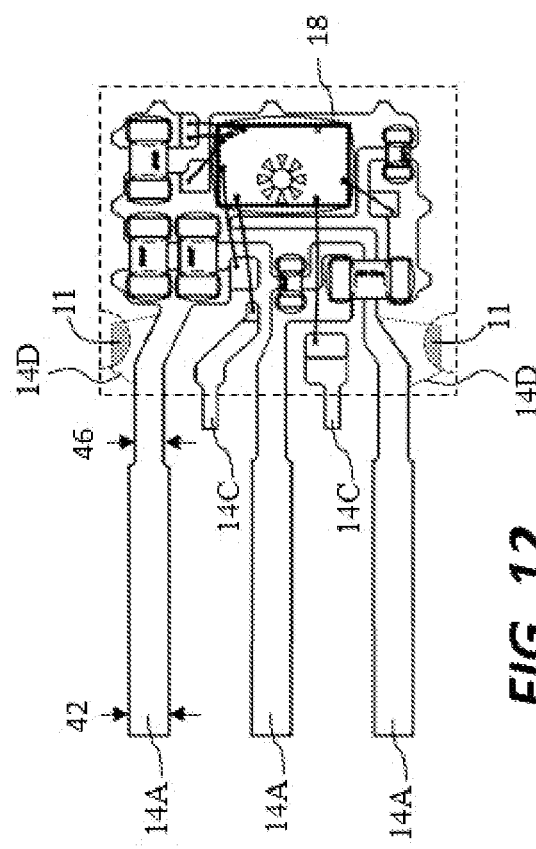
FIG. 11 to FIG. 18 are mainly intended to illustrate a sensor component having a housing with recesses.

The component 10 shown in FIG. 11 comprises a housing 12, and a lead frame, and a magnetic sensor circuit 18. The housing may comprise a thermoset plastic material. The lead frame comprises at least three elongated leads 14A having an exterior portion 15 extending from the housing 12. The magnetic sensor circuit 18 may comprise at least one Hall element, or a plurality of Hall elements, and is disposed in the housing, and is connected to the lead frame. The housing 12 comprises two recesses 13 arranged on opposite sides of the housing. The recesses may have a shape comprising a bottom portion substantially parallel to the lead frame. The recesses may have a frusto-conical wall portion or a cylindrical wall portion. The component 10 of FIG. 11 has three elongated leads 14A, but the invention is not limited thereto, and in alternative embodiments, the component 10 has five elongated leads 14A.

Figure 12:
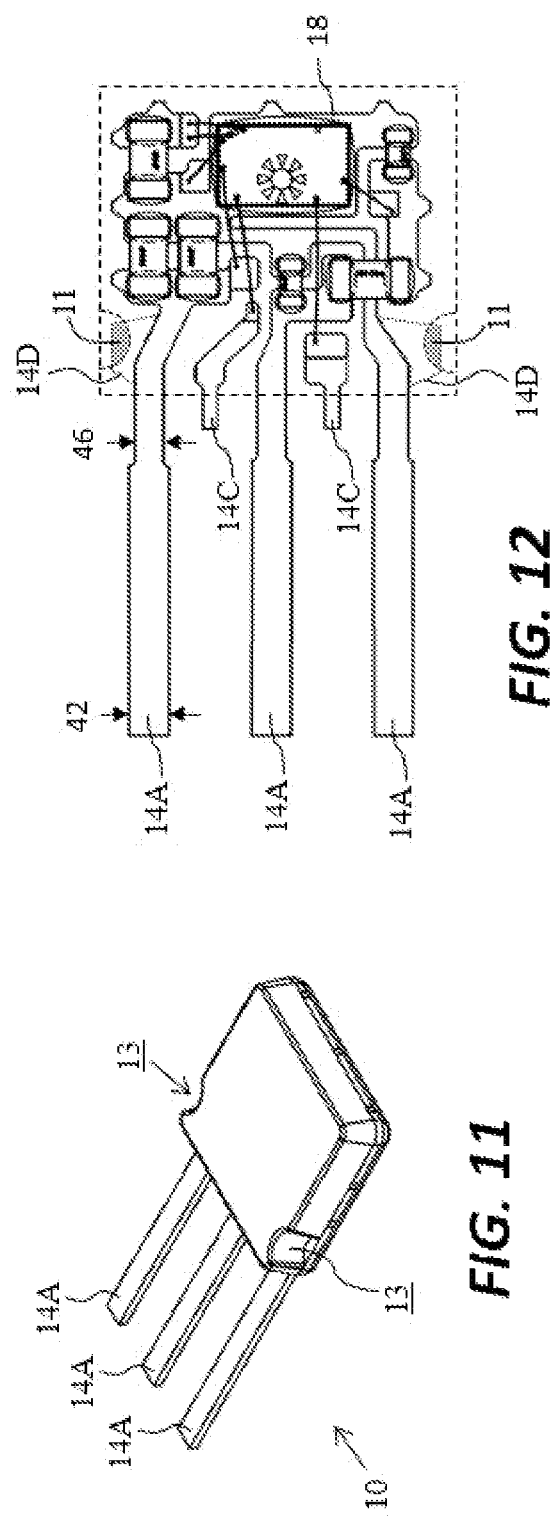

FIG. 12 shows a top view of the component of FIG. 11 without the housing, for illustrative purposes.

The component of FIG. 12 has three elongated leads 14A. The leads 14A of the component 10 shown in FIG. 12 do not have alignment holes 16, and therefore also do not require a central portion as described above.

The component 10 may comprise a plurality of tabs or test pins 14C located substantially halfway between proximal portions of the elongated leads 14A. These tabs or test pins 14C may have very small dimensions, for example have an external length of about 0.7 mm and an external width of about 0.3 mm, while allowing distal portions of the elongated leads to be spaced apart by about 2.5 mm from centerline to centerline. If the test pins are present (as shown in FIG. 12), the elongated leads 14A preferably have a proximal segment having a first width 46, and a distal segment having a second width 42 larger than the first width 46. If the test pins 14C are not present, the elongated leads 14A may have a constant width.

The recesses 13 of the housing 12 may overlap at least a portion 14D of the lead frame and/or of the elongated leads in an overlapping area 11. An inner portion of the elongated leads 14A may be broadened or widened to create such an overlap (see FIG. 12). Optionally, the lead frame portion containing the magnetic sensor circuit 18 contains the overlapping zones 11 (not shown).

Figure 13:
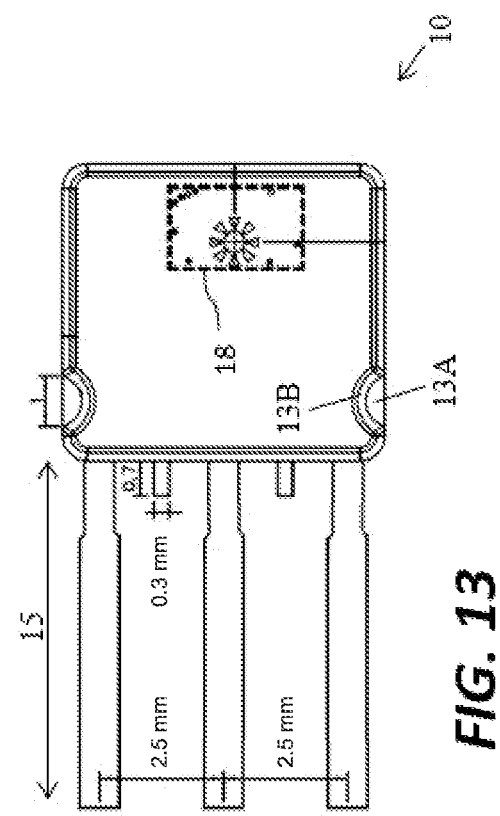

FIG. 13 shows the component of FIG. 11 in top view, including the housing. The component 10 of FIG. 13 has only two recesses 13, but the present invention is not limited thereto, and alternative embodiments may comprise three recesses, namely the two recesses shown in FIG. 13 plus an additional recess at the right side of FIG. 13, opposite the side where the leads 14 extend from the housing.

Figure 14:
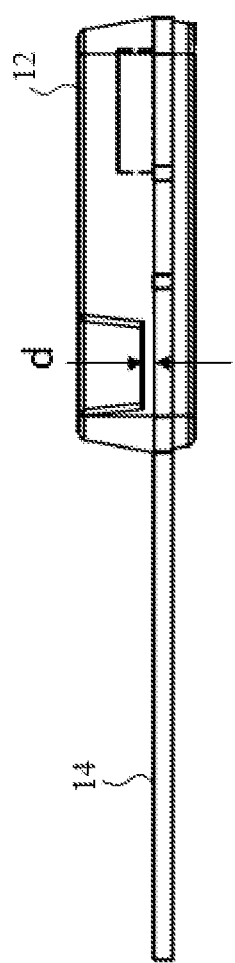

FIG. 14 shows the component of FIG. 13 in front view. A bottom of the recesses 13 of the housing 12 may be located at a predefined distance "d" (see FIG. 14) above the lead frame (e.g. at least 0.5 mm). Thus, the lead frame is not exposed at this location, but is covered for example by a plastic molding material, even at the location of the recesses 13.

Figure 15:
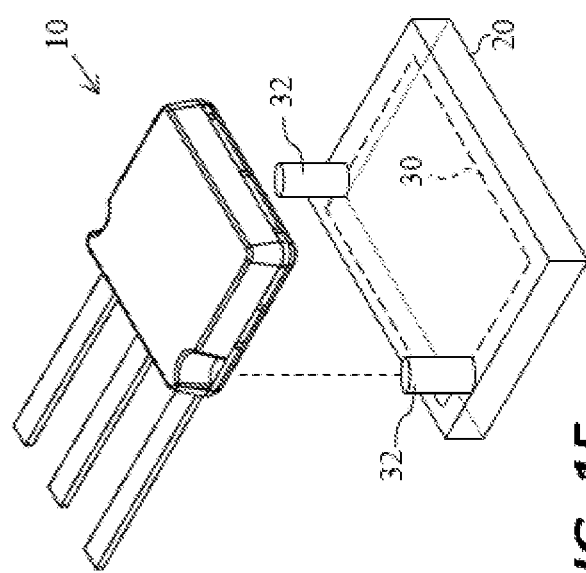

FIG. 15 shows the component of FIG. 11 and an exemplary support 20 comprising two protrusions 32 for holding said component 10. The support 20 may comprise or mainly comprise or consists of a plastic material. The protrusions 32 may have any suitable shape, e.g. substantially cylindrical. The support 20 has a receiving zone 30 between the two protrusions for accommodating the component 10. The distance between the protrusions 32 is preferably only marginally larger than an outer dimension of the housing 12. The protrusions 32 may be formed integrally with the rest of the support 20. The protrusions are made of a deformable material, e.g. thermoplastic or metal or a metal alloy.

Figure 16:
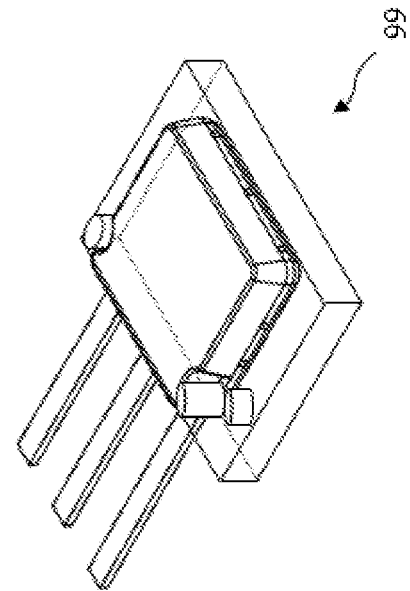

FIG. 16 shows a component assembly 99 comprising the support 20 and the component 10 of FIG. 15. The protrusions 32 are deformed so as to align the component 10 and so as to clamp the component 10 on the support 20.

Figure 17:
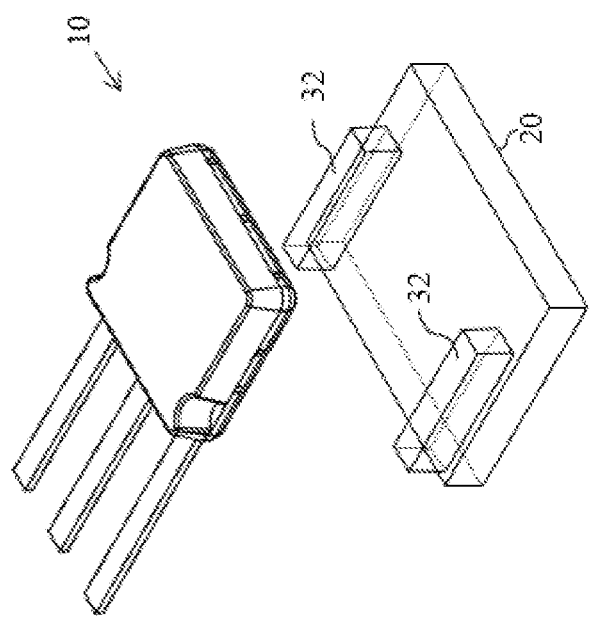

FIG. 17 shows the component of FIG. 11 and another exemplary support comprising two beam shaped protrusions 32 for holding said component 10.

The protrusions 32 are preferably deformed against an inclined wall of the component 10, and in such a manner that at least a portion of the protrusions enters the space defined by the recesses 13, for clamping the component 10. A component assembly (not shown) where the component is clamped in this manner, is also envisioned.

Figure 18:
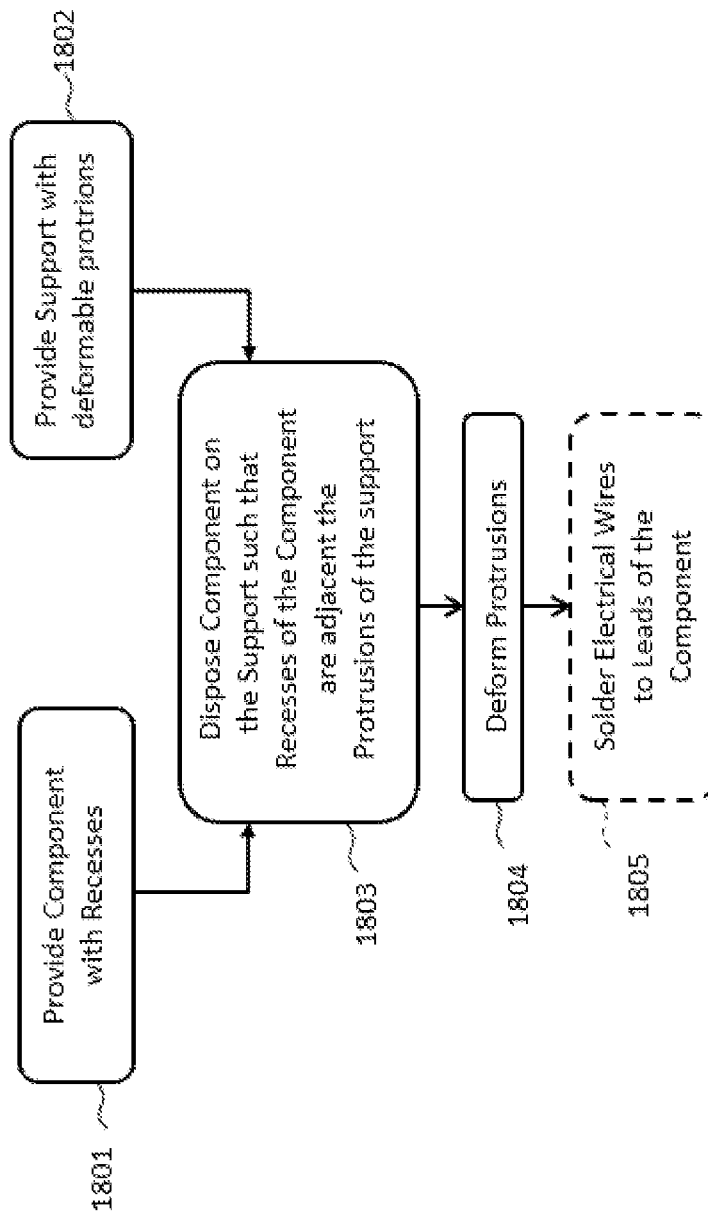

FIG. 18 illustrates a method 1800 of producing a component assembly 99, such as the one shown in FIG. 16. The method 1800 comprises the following steps:
  a) providing 1801 a component 10 with recesses 13, for example as shown in FIG. 11 to FIG. 17;
  b) providing a support 20 having a receiving zone 30 and at least two deformable protrusions 32, for example as shown in FIG. 15 and FIG. 17;
  c) disposing 1803 the component 10 on or over the support 20 within the receiving zone 30 between said protrusions 32 such that the recesses 13 of the component are located adjacent said protrusions 32 of the support 20; and
  d) deforming the protrusions 32 such that the protrusions are at least partially disposed within the recesses 13 (or stated in other words: such that at least a portion of the material of the protrusions has entered the recess), thereby aligning and clamping the component 10 on the support 20.

As is understood by those skilled in the art, the terms "over", "under", "above", "below", "beneath", and "on" are relative terms and can be interchanged in reference to different orientations of the layers, elements, and substrates included in the present invention. For example, a first layer, element, or structure on a second layer, element, or structure in some embodiments means a first layer, element, or structure directly on and in contact with a second layer, element, or structure. In other embodiments, a first layer, element, or element on a second layer, element, or structure can include another layer there between. Additionally, "on" can mean "on" or "in" or "in contact with" or "directly on."

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus, and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The invention claimed is:

1. A sensor comprising:
  a housing;
  a magnetic sensor circuit provided within the housing; and
  a lead frame that includes a body portion and a plurality of elongated leads, at least a portion of the body portion of the lead frame supporting the magnetic sensor circuit;
  wherein each of the elongated leads includes an interior portion and an exterior portion, the interior portion being located inside the housing and the exterior portion extending from the housing;
  wherein the elongated leads include a first lead and a second lead;
  wherein the first lead is integrally formed with the body portion of the lead frame;
  wherein the interior portion of the second lead includes a first portion, a second portion, and an intermediate portion, the intermediate portion of the second lead being situated electrically between the first portion of the second lead and the second portion of the second lead;
  wherein the sensor further comprises at least a first bond wire electrically connecting the second portion of the second lead and the magnetic sensor circuit;
  wherein the sensor further comprises at least a first passive, discrete component situated inside the housing, the first passive, discrete component having a first terminal electrically connected to the intermediate portion of the second lead and a second terminal electrically connected to the first lead; and
  wherein the first portion of the second lead extends from the intermediate portion of the second lead to the exterior portion of the second lead.

2. The sensor according to claim 1, wherein the housing includes a plurality of recesses including at least a first recess on a first side of the housing and a second recess on a second side of the housing, the first side of the housing being opposite from the second side of the housing, and
  wherein the recesses are configured to allow the sensor to be mounted by heat-stacking.

3. A component assembly comprising:
  a support having a receiving zone and at least two deformable protrusions including a first protrusion and a second protrusion adjacent to the receiving zone; and
  the sensor according to claim 2,
  wherein the sensor is disposed on or over the support within the receiving zone between the first protrusion and the second protrusion such that the first recess is adjacent to the first protrusion and the second recess is adjacent to the second protrusion; and
  wherein the first protrusion is at least partially disposed within the first recess and the second protrusion is at least partially disposed within the second recess.

4. A method of producing a component assembly, the method comprising the steps of:
  a) providing a sensor according to claim 2;
  b) providing a support having a receiving zone and at least two deformable protrusions including a first protrusion and a second protrusion adjacent to the receiving zone; and
  c) disposing the sensor on or over the support within the receiving zone between the protrusions such that the first recess is adjacent to the first protrusion and the second recess is adjacent to the second protrusion; and
  d) deforming the protrusions such that the first protrusion is at least partially disposed within the first recess and the second protrusion is at least partially disposed within the second recess and the sensor is aligned and clamped to the support.

5. The sensor according to claim 1, wherein the sensor further comprises a second passive, discrete component situated inside the housing, the second passive, discrete component having a first terminal electrically connected to the intermediate portion of the second lead and a second terminal electrically connected to the first lead.

6. The sensor according to claim 1, wherein the first passive, discrete component is a surface mount component.

7. The sensor according to claim 1, wherein the first passive, discrete component is a capacitor, a resistor, or a diode.

8. The sensor according to claim 1, wherein the first passive, discrete component is surface-mounted to the lead frame.

9. The sensor according to claim 1, wherein the second terminal of the first passive, discrete component is surface-mounted to part of the body portion of the lead frame.

10. The sensor according to claim 1, wherein the second terminal of the first passive, discrete component is surface-mounted to a portion of the first lead.

11. The sensor according to claim 1, wherein the lead frame defines in part an elongated cut-out, the elongated cut-out extending between a part of the body portion of the lead frame that supports the magnetic sensor circuit and an elongated interconnection portion that is part of the first lead.

12. The sensor according to claim 11, wherein the interconnection portion of the first lead has a width of about 0.3 mm over a major portion of a length of the elongated cut-out.

13. The sensor according to claim 11, wherein the body portion of the lead frame has a length in a direction parallel to the elongated cutout, and the body portion of the lead frame has a width in a direction perpendicular to the elongated cut-out, the length of the body portion being larger than the width of the body portion.

14. The sensor according to claim 1, wherein the interior portion of the first lead includes a first portion and a second portion, the first portion extending from the exterior portion of the first lead, the first portion extending in a first direction, and the second portion of the first lead extending from the first portion in a second direction, the second direction being transverse to the first direction.

15. The sensor according to claim 14, wherein the first direction is perpendicular to the second direction.

16. The sensor of claim 1, wherein the lead frame further includes an island and the elongated leads further include a third lead, wherein the interior portion of the third lead includes a first portion proximal to the exterior portion of the third lead, a second portion that is integral with the first portion of the third lead, and an intermediate portion, the intermediate portion of the third lead being situated electrically between the first portion of the third lead and the second portion of the third lead, the second portion of the third lead being distal from the exterior portion of the third lead;
  wherein the first portion of the third lead extends from the intermediate portion of the third lead to the exterior portion of the third lead;
  wherein the intermediate portion of the third lead is electrically connected to the first lead by at least a second passive, discrete component;
  wherein the island is electrically connected to the second portion of the third lead by at least a third passive, discrete component; and
  wherein the sensor further comprises a second bond wire electrically connecting the island and the magnetic sensor circuit, wherein the second bond wire and the second passive, discrete component and the third passive, discrete component are situated in the housing.

17. The sensor according to claim 1, wherein a narrowest width of the exterior portion of the first lead is in a range of 0.5 mm to 0.7 mm.

\* \* \* \* \*